(12) United States Patent
Anderson et al.

(10) Patent No.: US 11,430,735 B2
(45) Date of Patent: Aug. 30, 2022

(54) BARRIER REMOVAL FOR CONDUCTOR IN TOP VIA INTEGRATION SCHEME

(71) Applicant: INTERNATIONAL BUSINESS MACHINES CORPORATION, Armonk, NY (US)

(72) Inventors: Brent Alan Anderson, Jericho, VT (US); Nicholas Anthony Lanzillo, Wynantskill, NY (US); Christopher J. Penny, Saratoga Springs, NY (US); Lawrence A. Clevenger, Saratoga Springs, NY (US); Kisik Choi, Watervliet, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/791,400

(22) Filed: Feb. 14, 2020

(65) Prior Publication Data

US 2021/0257308 A1   Aug. 19, 2021

(51) Int. Cl.
*H01L 23/532* (2006.01)
*H01L 23/522* (2006.01)
*H01L 21/768* (2006.01)

(52) U.S. Cl.
CPC .. *H01L 23/53209* (2013.01); *H01L 21/76831* (2013.01); *H01L 21/76832* (2013.01); *H01L 21/76843* (2013.01); *H01L 21/76877* (2013.01); *H01L 23/5226* (2013.01)

(58) Field of Classification Search
CPC .......... H01L 23/53238; H01L 23/5226; H01L 23/53295; H01L 23/53209; H01L 21/76843; H01L 21/76807; H01L 21/76849
See application file for complete search history.

(56) References Cited

U.S. PATENT DOCUMENTS

| | | | |
|---|---|---|---|
| 5,484,747 A * | 1/1996 | Chien | H01L 21/76879 438/645 |
| 5,512,514 A | 4/1996 | Lee | |
| 5,693,568 A | 12/1997 | Liu | |
| 6,869,878 B1 | 3/2005 | Adem | |
| 7,608,537 B2 * | 10/2009 | Matsuo | G03F 9/708 257/E21.245 |
| 9,287,213 B2 * | 3/2016 | Zhang | H01L 21/76849 |
| 9,365,946 B2 | 6/2016 | Busnaina | |
| 9,613,861 B2 | 4/2017 | Anderson | |
| 10,020,254 B1 | 7/2018 | Bao | |
| 10,340,183 B1 * | 7/2019 | Fang | H01L 21/76847 |
| 2007/0232047 A1 * | 10/2007 | Fukasawa | H01L 21/76826 438/597 |

(Continued)

FOREIGN PATENT DOCUMENTS

WO   2017052559 A1   3/2017

*Primary Examiner* — Jaehwan Oh
*Assistant Examiner* — John M Parker
(74) *Attorney, Agent, or Firm* — Samuel A. Waldbaum

(57) ABSTRACT

A multi-layer device comprising a barrier or adhesion layer located on a portion of a first top surface of a first layer, a conductive metal layer located on barrier or adhesion layer; and a dielectric layer located on top of the first layer, wherein the dielectric layer is in direct contact with the sidewall of the conductive metal layer.

17 Claims, 3 Drawing Sheets

(56) References Cited

U.S. PATENT DOCUMENTS

| | | | |
|---|---|---|---|
| 2014/0097538 A1* | 4/2014 | Zhao | H01L 23/53295 257/751 |
| 2014/0175650 A1* | 6/2014 | Singh | H01L 21/76808 257/751 |
| 2015/0056800 A1 | 2/2015 | Mebarki | |
| 2018/0166334 A1* | 6/2018 | Kim | H01L 21/76849 |
| 2018/0226289 A1 | 8/2018 | Bielefeld | |
| 2019/0019748 A1 | 1/2019 | Wallace | |
| 2020/0144273 A1* | 5/2020 | Huang | H01L 27/10855 |

\* cited by examiner

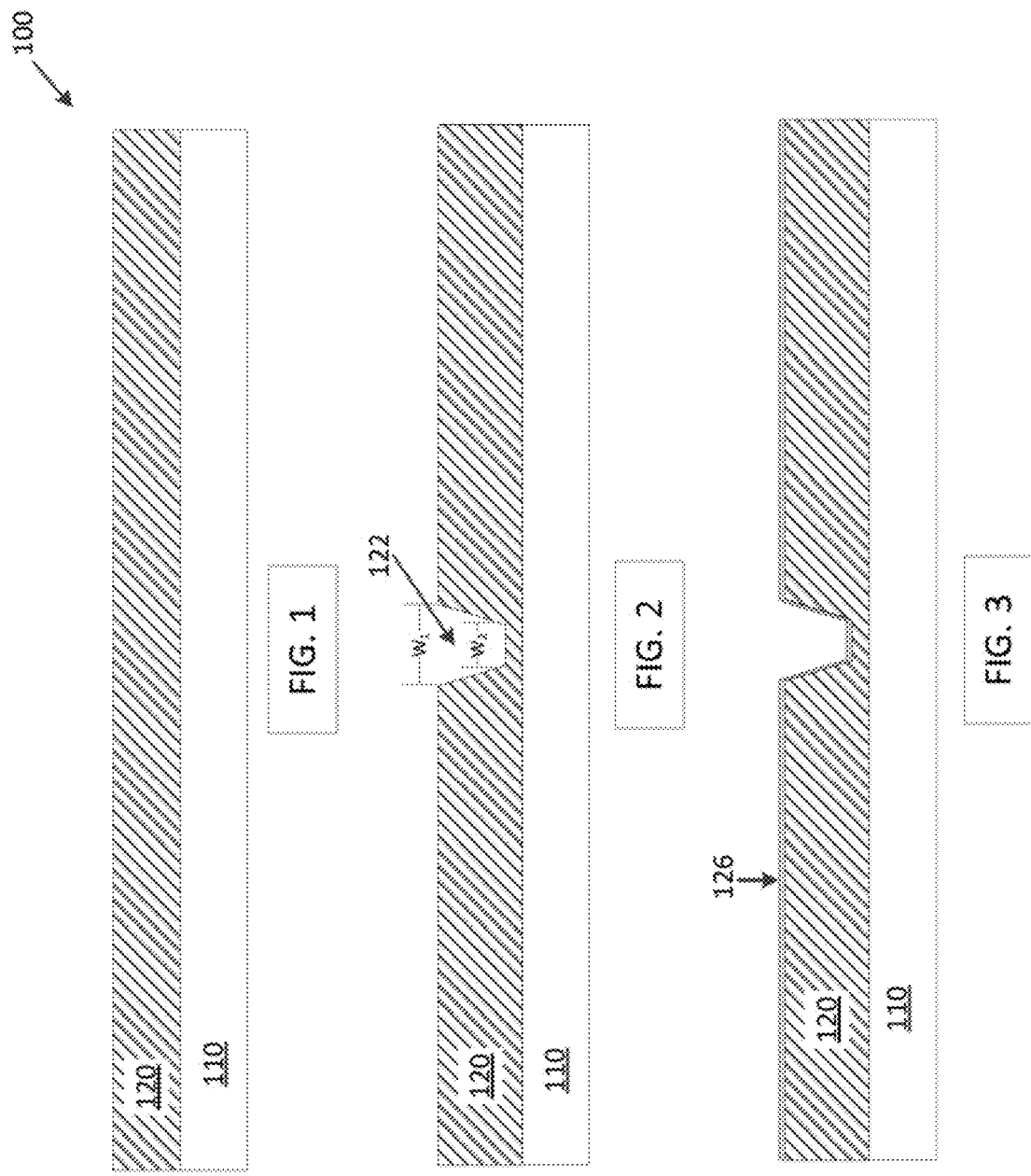

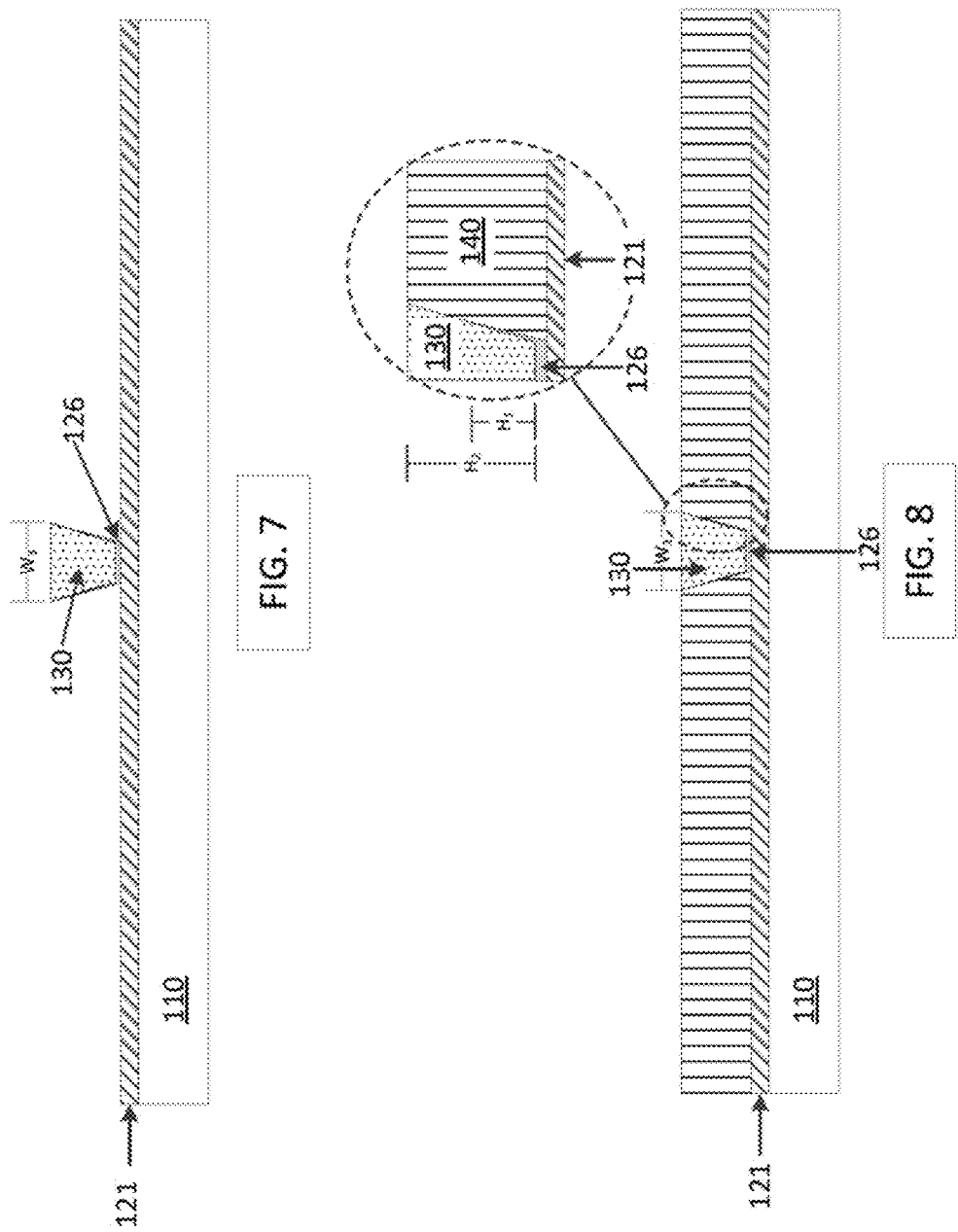

BARRIER REMOVAL FOR CONDUCTOR IN TOP VIA INTEGRATION SCHEME

BACKGROUND

The present invention relates generally to the field of integrated circuit, and more particularly to formation of a via filled with a conductor.

RC delay in advanced technology nodes with a tight pitch is very high, degrading device performance. Due to the requirement of barrier/liner layers within interconnect trenches, actual conductor volume is reduced, resulting in high line resistance. Patterned low-k dielectrics typically have a 1-2 nm damage layer surrounding trenches. The dielectric constant of this damage layer is around k=4.2, which significantly increases line capacitance.

BRIEF SUMMARY

Additional aspects and/or advantages will be set forth in part in the description which follows and, in part, will be apparent from the description, or may be learned by practice of the invention.

Embodiments of the present invention disclose a method and apparatus for making a dielectric-conductive metal-dielectric connection.

A multi-layer device comprising multi-layer device comprising a barrier or adhesion layer located on a portion of a first top surface of a first layer, a conductive metal layer located on barrier or adhesion layer; and a dielectric layer located on top of the first layer, wherein the dielectric layer is in direct contact with the sidewall of the conductive metal layer.

The first layer is selected from a group comprised of SiO2, SiN, SiC, SiCN, other suitable dielectrics, or any combination thereof.

The conductive metal layer is selected from a group comprised of Cu, Co, Ru, Pt, Rh, Ir, Mo, Ni, other conductive metals or alloys thereof.

The barrier or adhesion layer is selected from a group comprised of Ru, Co, Ni.

The multi-layered device of claim 1, wherein the barrier or adhesion layer extends up a portion of the sidewall of the conductive metal layer.

The thickness of the barrier or adhesion layer varies as it extends up the conductive metal layer.

The barrier or adhesion layer is thicker near the top surface of the first dielectric layer and gets thinner as the barrier or adhesion layer extends up the sidewall of the conductive metal layer.

The barrier or adhesion layer is thicker near the top surface of the first dielectric layer and gets thinner as the barrier or adhesion layer extends up the sidewall of the conductive metal layer.

The first layer and the dielectric layer are comprised of the same or different dielectric material.

A method comprising forming a barrier or adhesion layer on the exposed surface of a first layer within the trench/via, forming a conductive metal layer on the top surface of the barrier or adhesion layer within the trench/via, removing the first layer to expose the barrier or adhesion layer along the sidewalls of the conductive metal layer, removing the barrier or adhesion layer to expose sidewall of the conductive metal layer; and forming a dielectric layer on the surfaces of the first layer, wherein the dielectric layer is direct contact with the sidewalls of the conductive metal layer.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 1 illustrates a multi-layered apparatus that includes at least one dielectric layer, in accordance with an embodiment of the present invention.

FIG. 2 illustrates a via formed in the dielectric layer, in accordance with an embodiment of the present invention.

FIG. 3 illustrates the formation of the barrier/adhesion layer on the surface of the dielectric layer, in accordance with an embodiment of the present invention.

FIG. 7 illustrates the removal of a portion of the barrier/adhesion layer, in accordance with an embodiment of the present invention.

FIG. 8 illustrates the formation of a second dielectric layer, in accordance with an embodiment of the present invention.

DETAILED DESCRIPTION

Figure 4:
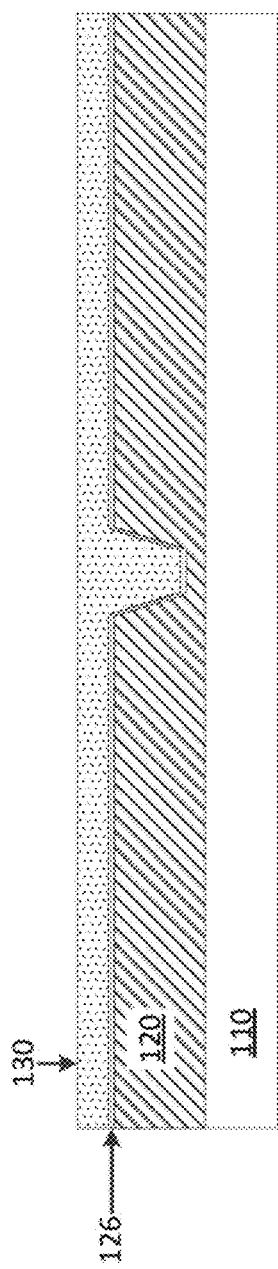
FIG. 4 illustrates the formation of a conductive metal layer on the barrier/adhesion layer, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an "example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e. two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity base upon the equipment available at the time of the filing of the application. For example, about can include a rang of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g. aluminum, copper, etc.) and insulators (e.g. various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. RC delay in advanced technology nodes with tight pitch is very high, degrading device performance. Due to the requirement of barrier/liner layers within interconnect trenches, actual conductor volume is reduced, resulting in high line resistance. Patterned low-k dielectrics typically have a 1-2 nm damage layer surrounding trenches. The dielectric constant of this damage layer is around k=4.2, which significantly increases line capacitance.

Embodiments of the invention are generally directed to the formation of a conductive via. Form a damascene interconnect with a larger-than-target width, which contains both the barrier/adhesion liner as well as the conductor. Remove the templating dielectric and etch away the barrier/liner, exposing the conductor metal. Replace with a low-k, undamaged dielectric. A first dielectric is etched to form a trench/via and a barrier/adhesion layer is formed on the top surfaces of the first dielectric layer, thus a liner is formed in the trench/via. A conductive metal layer is formed on the surface of the barrier/adhesion to fill the trench/via. The excess conductive metal and barrier/adhesion material is planarized to expose the first dielectric layer. The first dielectric layer is then etched in order to expose the barrier/adhesion layer of the trench/via. A portion of the barrier/adhesion layer is removed by utilizing wet chemistry, in order to expose the side walls of the conductor. A second dielectric layer is form, wherein the second dielectric layer can be the same or different material as the first dielectric layer. The second dielectric layer is planarized to expose the top surface of the conductive metal, where the sidewalls of conductive via comes into direct contact with the second dielectric layer.

FIG. 1 illustrates a multi-layered device 100 that includes at least one dielectric layer 120, in accordance with an embodiment of the present invention.

The multi-layered device 100 includes a first layer 110 and at least a first dielectric layer 120 as the top layer of the multi-layered device 100. The first layer 110 can be any type of material, for example, it can be, a substrate, silicon wafer, a sapphire wafer, a metal layer, a conductor layer, an insulator, or any other type of material used in creating multi-layered devices. The first dielectric layer 120 can be, for example, $SiO_2$, Ultra-low-k (ULK) dielectric with k=2.7, SiN, SiC, SiCN, other suitable dielectrics, or any combination thereof.

FIG. 2 illustrates a via formed in the first dielectric layer 120, in accordance with an embodiment of the present invention.

The first dielectric layer 120 is etched, for example, by utilizing a damascene patterning flow, including the deposition of hard mask materials, lithography, pattern transfer and ultimately reactive ion etching (RIE) of the first dielectric layer 120 to form the interconnect line (and via) features. The damascene process forms a trench/via 122 in the first dielectric layer 120. The trench/via 122 can have a constant width along the height of the trench/via 122, or it can have a variable width as illustrated by FIG. 2. The trench/via 122 as has a width $W_1$ located at the top of the trench/via 122 and a width $W_2$ located at the bottom of the trench/via 122, where $W_1$ is greater than $W_2$.

FIG. 3 illustrates the formation of the barrier/adhesion layer 126 on the surface of the first dielectric layer 120, in accordance with an embodiment of the present invention.

The barrier/adhesion layer 126 is formed on the top surface of the first dielectric layer 120. The barrier/adhesion layer 126 can be formed by utilizing, for example, physical vapor deposition (PVD), atomic layer deposition (ALD) and chemical vapor deposition (CVD), to form the barrier/adhesion layer 126 on the exposed surface of the trench/via 122. The barrier/adhesion layer 126 has a thickness in the range of about 1-2 nm. The materials to form barrier/adhesion layer 126 may include Ru, Co, Ni, or combinations thereof. The barrier/adhesion layer 126 is needed as a seed material for the formation of a conductive metal layer.

FIG. 4 illustrates the formation of a conductive metal layer 130 on the barrier/adhesion layer 126, in accordance with an embodiment of the present invention.

A conductive metal layer 130 is formed on the barrier/adhesion layer 126. The conductive metal layer 130 can be formed by utilizing, for example, physical vapor deposition (PVD), atomic layer deposition (ALD) and chemical vapor deposition (CVD), to form the conductive metal layer 130 on the exposed surface of the barrier/adhesion layer 126. The conductive metal layer 130 fills the remaining empty space within the trench/via 122. The conductive metal layer 130 can be comprised of, for example, Cu, Co, Ru, Pt, Rh, Ir, Mo, Ni, other conductive metals or alloys thereof.

Figure 5:
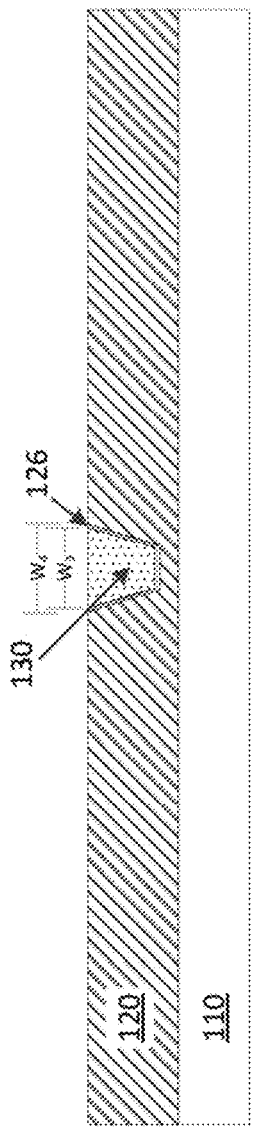
FIG. 5 illustrates the apparatus after planarization, in accordance with an embodiment of the present invention.

FIG. 5 illustrates the apparatus after planarization, in accordance with an embodiment of the present invention.

The multi-layered device 100 is planarized to removes the excess conductive metal layer 130 and the excess barrier/adhesion layer 126. The width $W_3$ of the conductive metal layer 130 in the trench/via 122 is the less than the width $W_4$ of the trench/via 122. The width of the barrier/adhesion layer 126 makes up the difference between the $W_4$ and $W_3$.

Figure 6:
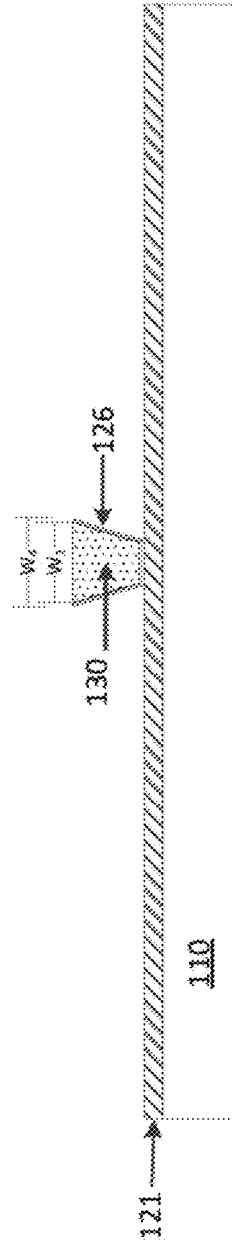
FIG. 6 illustrates the removal of the dielectric layer to expose the sides of the barrier/adhesion layer liner, in accordance with an embodiment of the present invention.

FIG. 6 illustrates the removal of a portion of the dielectric layer to expose the sides of the barrier/adhesion layer liner, in accordance with an embodiment of the present invention. A portion of the first dielectric layer 120 is removed to expose the barrier/adhesion layer 126, while a second portion 121 of the first dielectric layer remains. The first dielectric layer 120 is etched using any chemistry that gives sufficient selectivity between dielectric and metal (Cu, Co, Ru, TaN, etc.). A typical fluorine-based chemistry will etch dielectrics without etching metals. A second portion 121 of the first dielectric layer 120 is not remove, in the via region (i.e. the region below the interconnect lines) because removing second portion 121 of the first dielectric layer 120 here would undermine the structural stability of the lines located above. The via has a total width $W_4$ which is the combined width $W_3$ of the conductive metal layer 130 and the width of the barrier/adhesion layer 126.

FIG. 7 illustrates the removal of a portion of the barrier/adhesion layer, in accordance with an embodiment of the present invention.

By utilizing wet chemistry, the barrier/adhesion layer 126 along the sidewalls of the conductive metal layer 130 can be removed. This could be accomplished using any wet chemistry that has sufficient selectively between the barrier metal and the conductor itself. An example would be an "etch-J" chemistry which removes TaN selective to both Cu and Co/Ru. FIG. 7 illustrates that only a portion of the barrier/adhesion layer 126 is removed. The portion of the barrier/adhesion layer 126 that was removed was located near the top of the conductive metal layer 130. FIGS. 7 and 8 are for illustrative purpose only and are not meant to be limiting factors. The entirety or a portion of the barrier/adhesion layer 126 can be removed from the sidewalls of the conductive metal layer 130. The purpose of removing the barrier/adhesion layer 126 is to expose at least a portion of the sidewall of the conductive metal layer 130. As illustrated by FIG. 7, the barrier/adhesion layer 126 can have a varying thickness along it height after the removal process, meaning, barrier/adhesion layer 126 will be thicker closer towards the bottom of the conductive metal layer 130. The thickness of the barrier/adhesion layer 126 thins out as barrier/adhesion layer 126 extends up the sidewall of the conductive metal layer 130. The thickness of the barrier/adhesion layer 126 reaches zero prior to reaching the top of the conductive metal layer 130. The point at which the thickness of the barrier/adhesion layer reaches zero is control by the wet chemistry removal process. By exposing the sidewall of the conductive metal layer 130, it allows for the formation of a dielectric-conductive metal-dielectric bond. The barrier/adhesion layer 126 prevents the dielectric-conductive metal-dielectric bond from forming since it insulates the conductive metal from the dielectric material.

FIG. 8 illustrates the formation of a second dielectric layer, in accordance with an embodiment of the present invention.

A second dielectric layer 140 is formed on top of the remaining first dielectric layer 120, the barrier/adhesion layer 126, and on top of the conductive metal layer 130. The second dielectric 140 could be a low-k flowable dielectric, $SiO_2$, or the same dielectric utilized as the first dielectric layer 120. The benefit is that there is no damage layer due to etching. A spin-on glass (SOG) dielectric could also be utilized in the formation of the second dielectric layer 140. The second dielectric layer 140 is in direct contact with the sidewalls of the conductive metal layer 130, which allows for the formation of a dielectric-conductive metal-dielectric bond. The multi-layer device 100 is than planarized to expose the top of the conductive metal layer 130. The second dielectric layer 140 is direct contact with the sidewalls of the conductive metal layer 130.

The primary advantage to putting a replacement dielectric in the line region is to reduce line-to-line capacitance. Putting a replacement dielectric in the via region would have limited benefit in terms of capacitance. During fabrication of the multi-layered device damage can occur on the surface of the first dielectric layer 120. The damages areas, not shown, of the first dielectric layer 120 could affect device operational performance. By replacing the portion of the first dielectric layer 120 to expose the barrier/adhesion layers 126, also has the added benefit of removing the damaged portions of the first dielectric layer 120. By removing the barrier/adhesion layers 126 along the sidewalls of the conductive metal layers 130 allows direct conductor-to-dielectric contact when the second dielectric layer 140 is formed.

The via that is formed is composed of a conductive metal layer 130 and a barrier/adhesion layer 136. The barrier adhesion layer 126 separates a portion of conductive metal layer 130 from coming into direct contact with the second dielectric layer 140. The magnified area illustrates a section of the conductive metal layer 130, barrier/adhesion layer 126, and the second dielectric layer 140 interface. The conductive metal layer 130 has a height $H_1$. The barrier/adhesion layer 126 extends along the sidewall of the conductive metal layer 126 for a height $H_2$. The height $H_2$ as illustrated is about 50% of height $H_1$, but this is just illustrative example. The height $H_2$ can be, for example, 10%, 25%, 40%, 50%, 60%, 75%, or a different percentage of height $H_1$. Height $H_1$ needs to be greater than height $H_2$ so that a portion of the conductive metal layer 130 can come into direct contact with the second dielectric layer 140.

The barrier/adhesion layer 126 thickness varies along height $H_2$. The thickness of the barrier/adhesion layer 126 thins out as barrier/adhesion layer 126 extends up the sidewall of the conductive metal layer 130. The thickness of the barrier/adhesion layer 126 reaches zero prior to reaching the top of the conductive metal layer 130. The barrier/adhesion layer 126 will be thicker closer towards the bottom of the conductive metal layer 130.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A multi-layer device comprising:
    a barrier or adhesion layer located on a portion of a first top surface of a first layer;
    a conductive metal layer located on the barrier or adhesion layer; and
    a dielectric layer located on top of the first layer, wherein a sidewall of the dielectric layer is in direct contact with a sidewall of the conductive metal layer, wherein the same sidewall of the dielectric layer is direct contact with the conductive metal layer and the barrier or adhesion layer, wherein the barrier or adhesion layer extends up from a bottom surface of the conducive metal to 10% to 75% the height of the sidewall of the conductive metal layer.

2. The multi-layered device of claim 1, wherein the first layer is selected from a group comprised of SiO2, SiN, SiC, SiCN, other suitable dielectrics, or any combination thereof.

3. The multi-layered device of claim 1, wherein the conductive metal layer is selected from a group comprised of Cu, Co, Ru, Pt, Rh, Ir, Mo, Ni, other conductive metals or alloys thereof.

4. The multi-layered device of claim 1, wherein the barrier or adhesion layer is selected from a group comprised of Ru, Co, Ni.

5. The multi-layered device of claim 1, wherein the thickness of the barrier or adhesion layer varies as it extends up the conductive metal layer.

6. The multi-layered device of claim 5, wherein the barrier or adhesion layer is thicker near the top surface of the first layer and gets thinner as the barrier or adhesion layer extends up the sidewall of the conductive metal layer.

7. The multi-layered device of claim 1, wherein the barrier or adhesion layer is thicker near the top surface of the first layer and gets thinner as the barrier or adhesion layer extends up the sidewall of the conductive metal layer.

8. The multi-layered device of claim 1, wherein the first layer and the dielectric layer are comprised of the same dielectric material.

9. The multi-layered device of claim 1, wherein the first layer and the dielectric layer are comprised of different dielectric materials.

10. A multi-layer device comprising:
    a barrier or adhesion layer located on a portion of a first top surface of a first layer;
    a conductive metal layer located on the barrier or adhesion layer; and a dielectric layer located on top of the first layer, wherein a sidewall of the dielectric layer is in direct contact with a sidewall of the conductive metal layer;

wherein the barrier or adhesion layer is thicker near a top surface of the first layer and gets thinner as the barrier or adhesion layer extends up the sidewall of the conductive metal layer.

11. The multi-layered device of claim 10, wherein the first layer is selected from a group comprised of SiO2, SiN, SiC, SiCN, other suitable dielectrics, or any combination thereof.

12. The multi-layered device of claim 10, wherein the conductive metal layer is selected from a group comprised of Cu, Co, Ru, Pt, Rh, Ir, Mo, Ni, other conductive metals or alloys thereof.

13. The multi-layered device of claim 10, wherein the barrier or adhesion layer is selected from a group comprised of Ru, Co, Ni.

14. A multi-layer device comprising:
a barrier or adhesion layer located on a portion of a first top surface of a first layer;
a conductive metal layer located on the barrier or adhesion layer, wherein the barrier or adhesion layer extends up a portion of a sidewall of the conductive metal layer, wherein the thickness of the barrier or adhesion layer varies as it extends up the conductive metal layer; and
a dielectric layer located on top of the first layer, wherein the dielectric layer is in direct contact with the sidewall of the conductive metal layer, wherein the barrier or adhesion layer is thicker near a top surface of the first layer and gets thinner as the barrier or adhesion layer extends up the sidewall of the conductive metal layer.

15. The multi-layered device of claim 14, wherein the first layer is selected from a group comprised of SiO2, SiN, SiC, SiCN, other suitable dielectrics, or any combination thereof.

16. The multi-layered device of claim 14, wherein the conductive metal layer is selected from a group comprised of Cu, Co, Ru, Pt, Rh, Ir, Mo, Ni, other conductive metals or alloys thereof.

17. The multi-layered device of claim 14, wherein the barrier or adhesion layer is selected from a group comprised of Ru, Co, Ni.

* * * * *